(12) United States Patent
Kim et al.

(10) Patent No.: US 8,471,354 B2
(45) Date of Patent: Jun. 25, 2013

(54) E-FUSE STRUCTURE OF SEMICONDUCTOR DEVICE

(75) Inventors: Deok-kee Kim, Seoul (KR); Soojung Hwang, Gunpo-si (KR); Sang-Min Lee, Seoul (KR); Il-Sub Chung, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 287 days.

(21) Appl. No.: 12/716,346

(22) Filed: Mar. 3, 2010

(65) Prior Publication Data
US 2010/0224956 A1   Sep. 9, 2010

(30) Foreign Application Priority Data

Mar. 6, 2009 (KR) ................. 10-2009-0019272

(51) Int. Cl.
*H01L 23/52* (2006.01)
(52) U.S. Cl.
USPC ................. 257/529; 257/E23.149
(58) Field of Classification Search
USPC ............. 257/529, E23.149; 438/132, 467, 438/468, 601
See application file for complete search history.

(56) References Cited

U.S. PATENT DOCUMENTS

| 7,288,804 | B2 | 10/2007 | Booth, Jr. et al. | |
|---|---|---|---|---|
| 2005/0285224 | A1* | 12/2005 | Tsutsui | 257/531 |
| 2009/0001506 | A1* | 1/2009 | Kim et al. | 257/529 |
| 2009/0021338 | A1* | 1/2009 | Kim et al. | 337/227 |

FOREIGN PATENT DOCUMENTS

| JP | 2003-068856 | 3/2003 |
|---|---|---|
| JP | 2004-311638 | 11/2004 |
| KR | 1020080000513 A | 1/2008 |

OTHER PUBLICATIONS

M.A. Korhonen et al., "Stress evolution due to electromigration in confined metal lines," J. Appl. Phys. 73 (8), Apr. 15, 1993, p. 3790-3799.
S. Pidin et al., "MOSFET Current Drive Optimization Using Silicon Nitride Capping Layer for 65-nm Technology Node," 2004 Symposium on VLSI Technology Digest of Technical Papers, pp. 54-55.

* cited by examiner

*Primary Examiner* — Robert Huber
(74) *Attorney, Agent, or Firm* — Volentine & Whitt, PLLC

(57) ABSTRACT

An e-fuse structure includes an anode, a cathode, a fuse part connecting the anode and the cathode to each other, and a dielectric contacting the fuse part. The dielectric is configured to apply a stress to the fuse part, where the stress constructively acting on a migration effect of atoms constituting the fuse part. The migration effect is generated by electromigration and thermomirgration.

13 Claims, 8 Drawing Sheets

E-FUSE STRUCTURE OF SEMICONDUCTOR DEVICE

CROSS-REFERENCE TO RELATED APPLICATIONS

A claim of priority under 35 U.S.C. §119 is made to Korean Patent Application No. 10-2009-0019272, filed on Mar. 6, 2009, the entire contents of which are hereby incorporated by reference.

BACKGROUND

The inventive concepts described herein generally relate to semiconductor devices, and more particularly, to e-fuse structures of semiconductor devices.

In semiconductor device technologies, fuses are used for a variety of purposes. For example, to improve chip yield, fuses of memory devices are typically used in a repair process in which a bad (defective) memory cell is replaced with a redundancy memory cell. As other examples, fuses may be used to customize and/or optimize chip characteristics after fab-out, and fuses may be used to record/indentify chip information and/or fabrication histories.

Fuses may be classified as either laser fuses or e-fuses. Laser fuses are configured to be selectively programmed (that is, opened) by utilization of a laser, and e-fuses are configured to be selectively programmed by utilization of electric current.

Since propagating depth of a laser is limited, laser fuses are disposed at or near an exposed surface. Thus, for example, laser fuses must be programmed before formation of an opaque passivation layer (e.g., epoxy) which may cover or encapsulate a semiconductor chip. As a result, laser fuses cannot be used for chip customization and/or optimization after fab-out. Further, laser programming of fuses requires an expensive laser device and a relatively long programming time.

In contrast, e-fuses have the advantage of being programmable after fab-out, and programming can be conveniently executed during electrical testing of the chip and without the need for an expensive laser device.

SUMMARY

Embodiments of the inventive concepts provide e-fuse structures including an anode, a cathode, a fuse part connecting the anode and the cathode to each other, and a dielectric contacting the fuse part. The dielectric is configured to apply a stress to the fuse part, where the stress is constructively acting on a migration effect of atoms constituting the fuse part. The migration effect is generated by electromigration and thermomirgration.

In other embodiments of the inventive concepts, e-fuse structures of a semiconductor device include a fuse part including a depletion region and an accumulation region and connecting an anode and a cathode to each other, a first dielectric contacting the depletion region of the fuse part, and a second dielectric contacting the accumulation region of the fuse part. The first dielectric applies a larger compressive stress to the fuse part than does the second dielectric.

In still other embodiments of the inventive concepts, e-fuse structures of a semiconductor device include a fuse part including a depletion region and an accumulation region and connecting an anode and a cathode to each other, a first stress dielectric contacting the depletion region of the fuse part and formed of at least one of materials applying a compressive stress to the fuse part, and a second stress dielectric contacting the accumulation region of the fuse part and formed of at least one of materials applying a tensile stress to the fuse part.

BRIEF DESCRIPTION OF THE DRAWINGS

The accompanying figures are included to provide a further understanding of the inventive concepts, and are incorporated in and constitute a part of this specification. The drawings illustrate exemplary embodiments of the inventive concepts and, together with the description, serve to explain principles of the inventive concepts. In the figures.

DETAILED DESCRIPTION OF THE EMBODIMENTS

Figure 1:
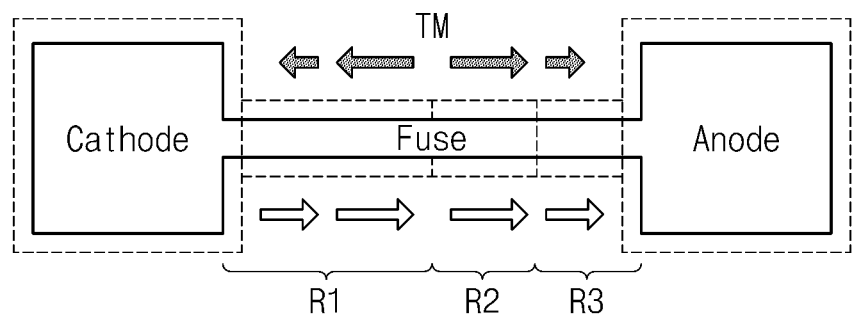
FIG. 1 is a schematic view illustrating an effect of thermomigration and eletromigration in an e-fuse.

Exemplary embodiments of the inventive concepts will be described below in more detail with reference to the accompanying drawings. The inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art. Like reference numerals refer to like elements throughout.

In the specification, it will be understood that when a layer (or film) is referred to as being 'on' another layer or substrate, it can be directly on the other layer or substrate, or intervening layers may also be present. In the figures, the dimensions of layers and regions are exaggerated for clarity of illustration. Also, though terms like a first, a second, and a third are used to describe various regions and layers in various embodiments of the inventive concept, the regions and the layers are not limited to these terms. These terms are used only to discriminate one region or layer from another region or layer. Therefore, a layer referred to as a first layer in one embodiment can be referred to as a second layer in another embodiment. An embodiment described and exemplified herein includes a complementary embodiment thereof.

Figure 2:
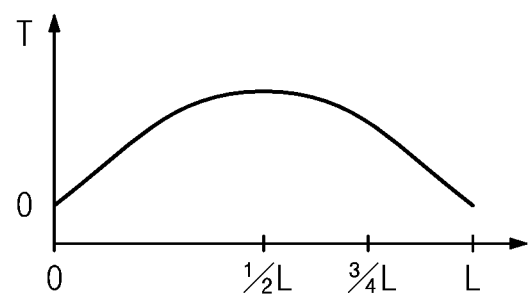
FIG. 2 is a graph illustrating a temperature distribution of a fuse part in a program process of an e-fuse.
Figure 3:
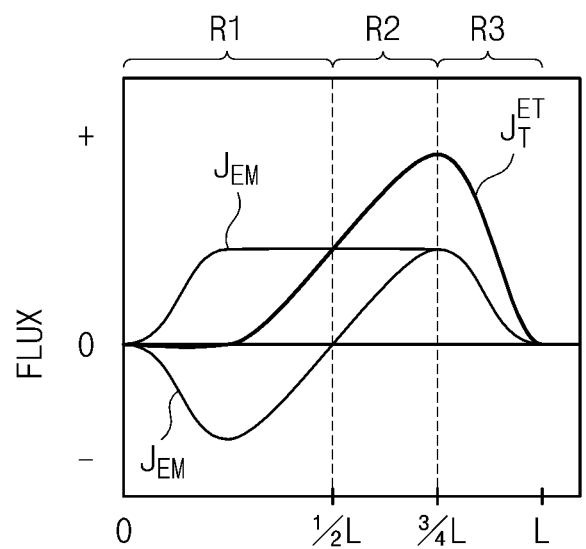
FIG. 3 is a graph illustrating an effect of thermomigration and electromigration occurring in a program process of an e-fuse.

FIG. 1 is a schematic view illustrating effects of thermomigration and eletromigration in an e-fuse having a basic structure corresponding to that of embodiments according to the inventive concept. FIG. 2 is a graph illustrating a temperature distribution of a fuse part in a program process of an e-fuse. FIG. 3 is a graph illustrating effects of thermomigration and electromigration occurring in a program process of an e-fuse.

Referring to FIG. 1, the e-fuse includes a cathode, an anode, and a fuse part connecting the cathode and the anode to each other. Programming of the e-fuse includes forming potential difference between the cathode and the anode to apply a program current via the fuse part.

The program current may cause electromigration used for a typical e-fuse program. Electromigration is spatial migration of atoms constituting the fuse part caused by momentum exchange between conducting electrons and the atoms. Due to this migration of atoms, a depletion region and an accumulation region may be formed in the fuse part. The programming principle of the e-fuse relies on an increase in resistance of the fuse part resulting from the depletion region.

The fuse part may be formed of metal such as tungsten, aluminum, and copper. According to the inventors' experiments, when the fuse part is formed of metal and has a predetermined size, the thermomigration phenomena may occur at a considerable level relative to the electromigration phenomena.

More particularly, as shown in FIG. 2, Joule's heat generated by the program current may form an uneven temperature distribution in the fuse part, i.e., along the length L of the fuse part. A temperature gradient due to the uneven temperature distribution may cause migration of the atoms constituting the fuse part (hereinafter, thermomigration). A total atomic flux ($J_T^{ET}$, atoms·m$^2$/sec) according to the electromigration and the thermomigration can be expressed by the following equation.

$$J_T^{ET} = J_{EM} + J_{TM} = \frac{DC}{kT} z * e\rho j - \frac{DC}{kT} \cdot \frac{Q*}{T} \left( \frac{\partial T}{\partial x} \right)$$

where $J_{EM}$ denotes an atomic flux due to electromigration (hereinafter, electronic flux), $J_{TM}$ denotes an atomic flux due to thermomigration (hereinafter, thermal flux), C denotes an atomic concentration (atoms/m$^3$), D denotes diffusivity (m$^2$/s), k is the Boltzmann constant, z* denotes an effective charge number, e denotes a unit charge, j denotes a current density (A/m$^2$), ρ denotes resistivity (Ωm), T is a temperature, Q* denotes heat of transport, and x denotes a distance along the fuse. The electronic flux, the thermal flux, and the total atomic flux may be expressed as a space-flux graph as illustrated in FIG. 3.

Referring to FIG. 3, since the electronic flux $J_{EM}$ is caused by momentum of electrons constituting the program current as illustrated in FIG. 1, the electronic flux $J_{EM}$ has a direction extending from the cathode to the anode regardless of the position of the fuse part. Meanwhile, since the thermal flux $J_{TM}$ is caused by a temperature gradient as illustrated in FIG. 2, the thermal flux $J_{TM}$ has a direction extending from the center L/2 of the fuse part having the maximum temperature to the cathode and the anode. Thus, the electronic flux $J_{EM}$ and the thermal flux $J_{TM}$ destructively superpose each other between the center L/2 of the fuse part and the cathode, and the electronic flux $J_{EM}$ and the thermal flux $J_{TM}$ constructively superpose each other between the center L/2 of the fuse part and the anode, which are illustrated in FIG. 3. In this case, referring to FIGS. 2 and 3, the fuse part is divided into a first region R1 between the cathode and a point (e.g. the center L/2) of the fuse part having the maximum temperature, a second region R2 between the first region R1 and a maximum point (e.g./3;4L) in the thermal flux $J_{TM}$, and a third region R3 between the second region R2 and the anode, which will be used in the same manner to simplify the description that follows.

A depletion region may be formed in the second region R2 where the total atomic flux $J_T^{ET}$ is increased, and an accumulation region may be formed in the third region R3 where the total atomic flux $J_T^{ET}$ is decreased. The electronic flux $J_{EM}$ and the thermal flux $J_{TM}$ are constructively superposed in the second and third regions R2 and R3. That is, an electronic depletion region and an electronic accumulation region resulting from the electromigration respectively superpose a thermal depletion region and a thermal accumulation region resulting from the electromigration, thus amplifying depletion and accumulation in the superposition regions.

Figure 4:
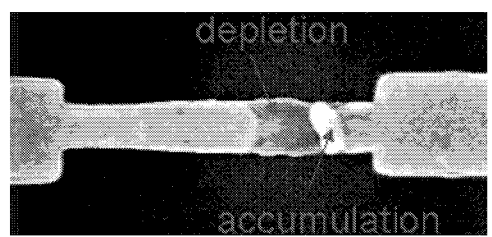
FIG. 4 is a microscope image illustrating a programmed metal e-fuse.

Embodiments of a fuse structure according to the inventive concepts can be programmed with a program current or program density that is lower than those of typical e-fuses. Furthermore, embodiments of a fuse structure according to the inventive concepts offer an improved effect of migration that increases a ratio of resistance values of the fuse part measured before and after programming. Thus, the area occupied by a sensing circuit of the e-fuse can be decreased. For example, when the ratio of resistance values is increased, the state of the e-fuse can be sensed through a single-ended sensing circuit integrated in a small area, as opposed to through a differential sensing circuit requiring a large area. FIG. 4 is a microscope image illustrating an e-fuse programmed with a program voltage of about 0.8 volts as an example of a basic structure of an e-fuse according to the inventive concepts.

Figure 5:
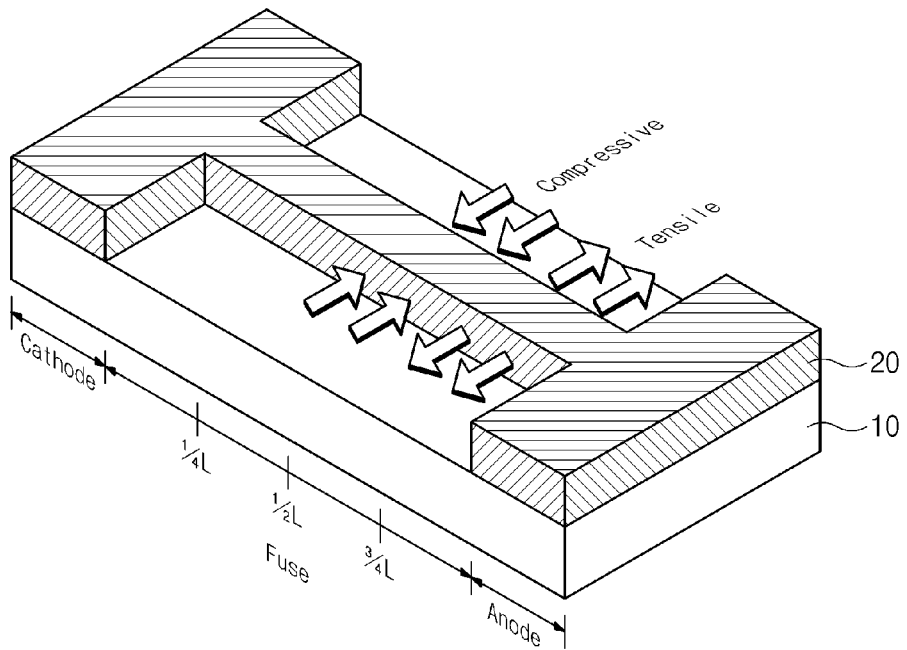
FIGS. 5 and 6 are perspective views illustrating a two-dimensional e-fuse structure according to an embodiment of the inventive concepts.
Figure 6:
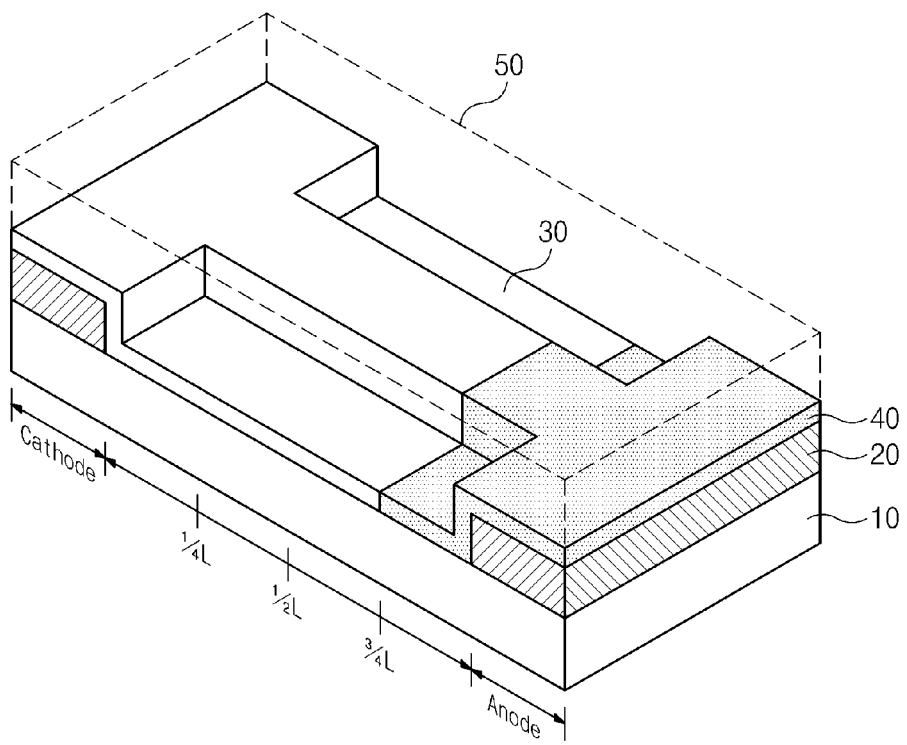
Figure 7:
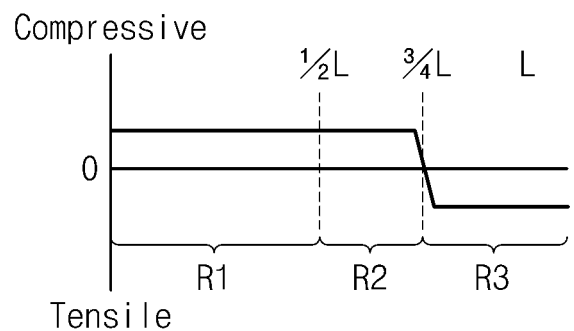
FIG. 7 is a graph illustrating stress characteristics applied to a fuse part of the e-fuse structure of FIGS. 5 and 6.
Figure 8:
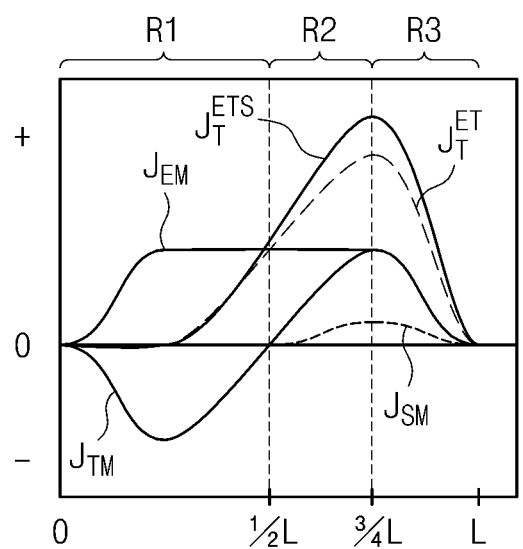
FIG. 8 is a graph illustrating effects of thermomigration, electromigration, and stress-migration of the e-fuse structure of FIGS. 5 and 6.

FIGS. 5 and 6 are perspective views illustrating a two-dimensional e-fuse structure according to an embodiment of the inventive concepts. FIG. 7 is a graph illustrating stress characteristics applied to a fuse part of the e-fuse structure of FIGS. 5 and 6. FIG. 8 is a graph illustrating effects of thermomigration, electromigration, and stress-migration of the e-fuse structure of FIGS. 5 and 6.

Compared with the e-fuse described with reference to FIG. 1, the e-fuse structure according to the example of the current embodiment includes a first dielectric 30 and a second dielectric 40 applying physical stress to the fuse part.

More particularly, referring to FIGS. 5 and 6, the e-fuse structure according to the current embodiment includes a conductive layer 20 disposed on a lower layer 10, a stress dielectric covering at least one portion of the conductive layer 20, and an interlayer dielectric 50 covering the stress dielectric.

The lower layer 10 may be a dielectric thin layer, and be one of interlayer dielectrics disposed on transistors to support metal lines or a device isolation layer pattern disposed on a semiconductor substrate to limit an active region. The conductive layer 20 may be a thin layer that constitutes the cathode, the anode, and the fuse part.

Figure 15:
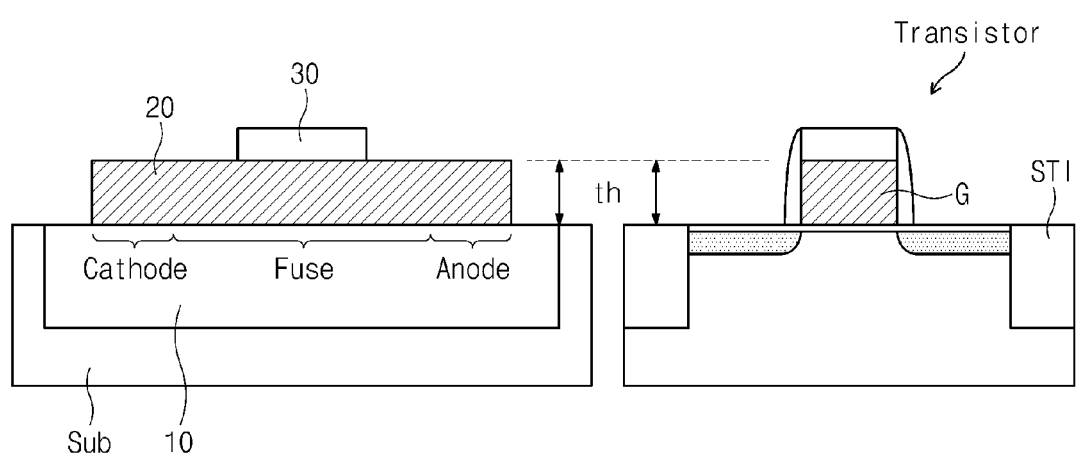
FIG. 15 is a sectional view illustrating a semiconductor device including an e-fuse and a transistor according to an embodiment of the inventive concepts.

According to an embodiment of the inventive concepts, the conductive layer 20 may be formed of at least one of metals such as tungsten, aluminum, and copper. For example, the conductive layer 20 and the metal lines may be formed through the same process. In this case, the conductive layer 20 and the metal lines may have substantially the same height and be formed of the same material. According to another embodiment of the inventive concepts, as shown in FIG. 15, the conductive layer 20 may have substantially the same height as that of a gate electrode G of a transistor, and be formed of at least one of materials (e.g., polycrystalline silicon and silicide) constituting the gate electrode G of the transistor.

According to the present embodiment, the stress dielectric may include a thin layer that applies compressive stress to the first and second regions R1 and R2 and applies tensile stress to the third region R3, as illustrated in FIGS. 5 and 7. For example, as shown in FIG. 6, the stress dielectric may include the first dielectric 30 applying compressive stress to the first and second regions R1 and R2 of the fuse part, and the second dielectric 40 applying tensile stress to the third region R3 of the fuse part. According to an embodiment of the inventive concepts, the first dielectric 30 may be tensile nitride, and the second dielectric 40 may be compressive nitride. As is known in the art, stress characteristic differences between the first and second dielectric 30 and 40 can be controlled by adjusting the composition thereof and conditions of a manufacturing process. Further, a difference in stress characteristic between the first and second dielectrics 30 and 40 can be realized from other materials, and thus the materials forming the first and second dielectrics 40 are not limited to the tensile nitride and compressive nitride.

The interlayer dielectric 50 may be formed of a material having a stress characteristic which is lower than those of the first dielectric 30 and the second dielectric 40. For example, the interlayer dielectric 50 may be silicon oxide.

Due to a difference between compressive stress applied to the second region R2 and tensile stress applied to the third region R3, a force directed from the second region R2 to the third region R3 may be applied to atoms near a boundary of the second region R2 and the third region R3. Depletion and accumulation in the second region R2 and the third region R3 described with reference to FIG. 3 may be further increased by this atomic migration due to the stress (hereinafter, stress-migration). Accordingly, the e-fuse structure according to the current embodiment, to which the stress-migration is added, can be programmed at a lower voltage and current than those of the e-fuse structure described with reference to FIG. 1 based on electromigration and thermomigration. FIG. 8 is a graph illustrating an atomic flux due to the stress-migration (hereinafter, stress flux $J_{SM}$) and a total atomic flux $J_T^{ETS}$ according to the stress flux $J_{SM}$.

FIGS. 9 through 12 are perspective views illustrating two-dimensional e-fuse structures according to embodiments of the inventive concepts.

Figure 9:
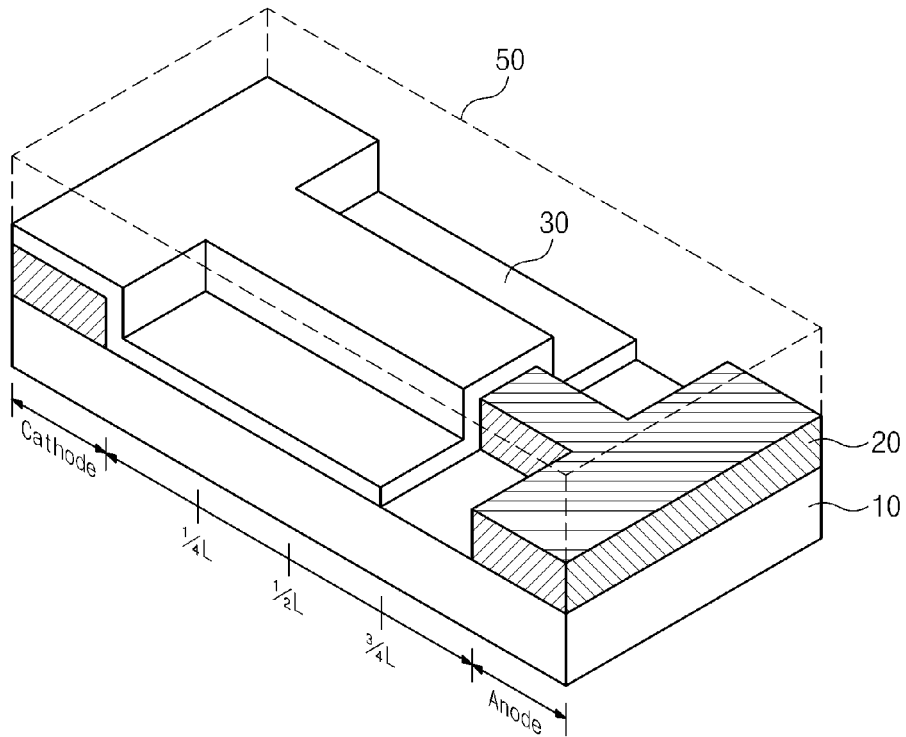
FIGS. 9 through 12 are perspective views illustrating two-dimensional e-fuse structures according to embodiments of the inventive concepts.
Figure 10:
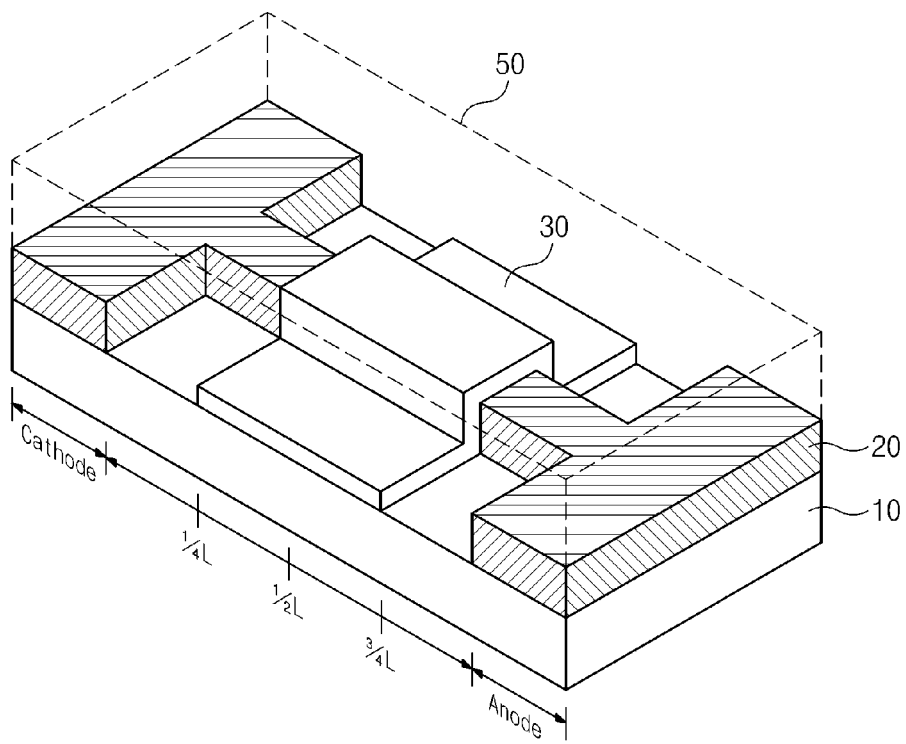

Referring to FIGS. 9 and 10, the stress dielectric of this example includes the first dielectric 30 applying compressive stress to the fuse part, and exposing the third region R3. In this case, since the third region R3 is covered with the interlayer dielectric 50 having a non-stress property, a stress-induced pressure is formed between the second region R2 and the third region R3 to cause the stress flux $J_{SM}$.

Figure 11:
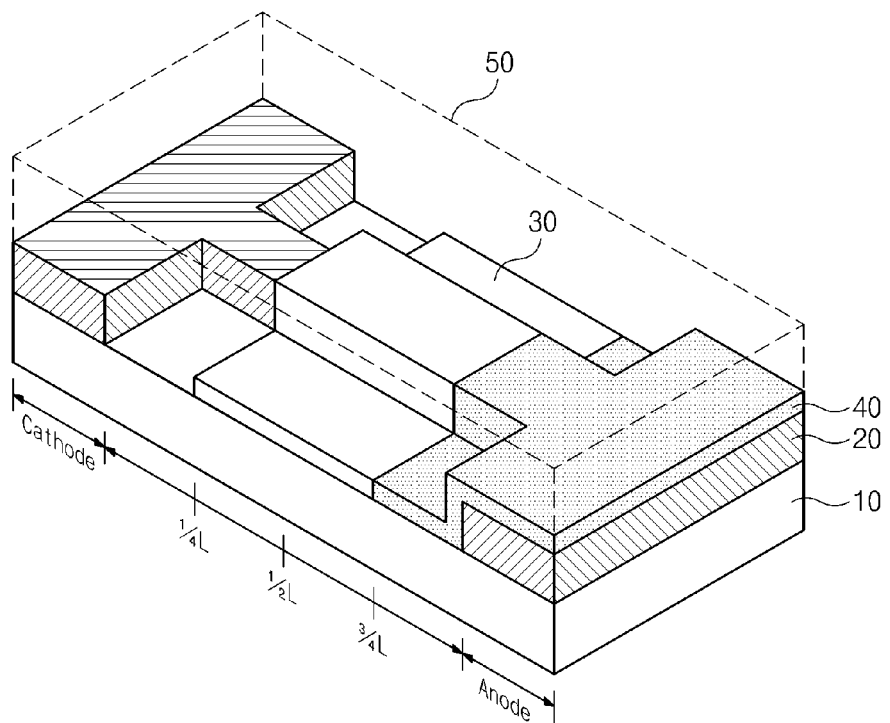

Referring to FIGS. 10 and 11, the stress dielectric of this example includes the first dielectric 30 applying compressive stress to the fuse part, and the first dielectric 30 may be formed to expose the cathode. For example, referring to FIG. 10, the first dielectric 30 may cover the second region R2 and a portion of the first region R1 adjacent to the second region R2. Referring to FIG. 8, the first dielectric 30 may cover the fuse part in a region where the atomic flux $J_T^{ET}$ due to electromigration and thermomigration is increased.

Figure 12:
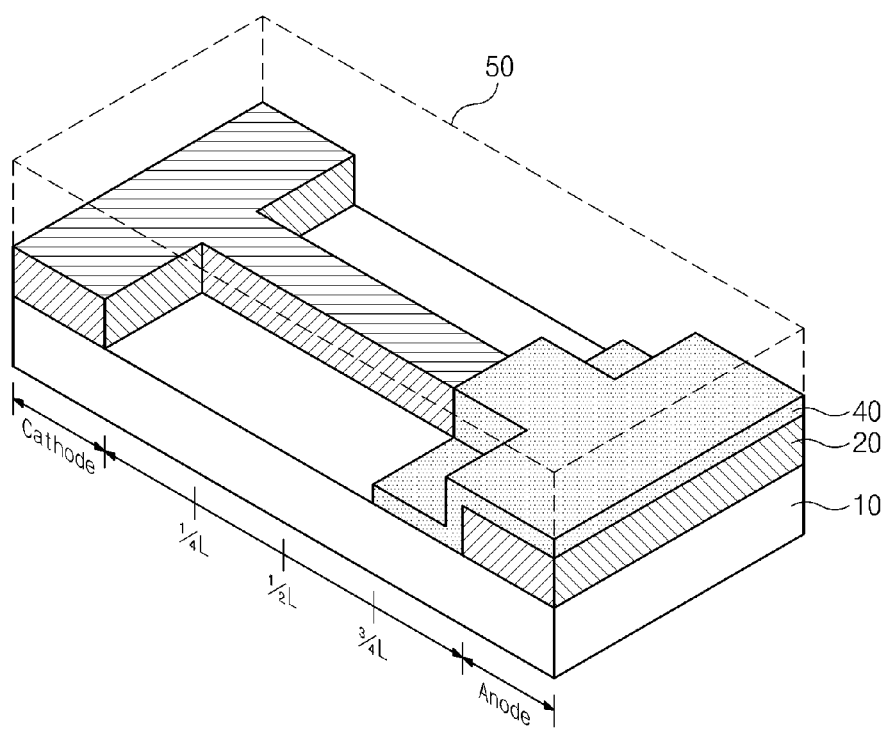

Referring to FIG. 12, the stress dielectric of this example includes the second dielectric 40 applying tensile stress to the fuse part and is formed to expose the second region R2. Since the second region R2 is covered with the interlayer dielectric 50 having a non-stress property, a stress-induced pressure is formed between the second region R2 and the third region R3 to cause the stress flux $J_{SM}$ in a similar manner to the embodiment of FIG. 9.

Figure 13:
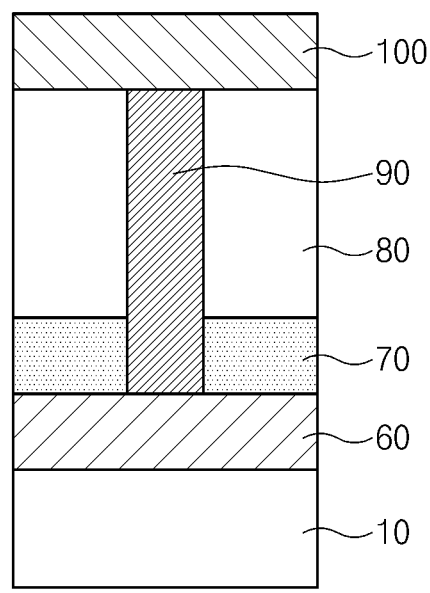
FIGS. 13 and 14 are schematic views illustrating three-dimensional e-fuse structures according to embodiments of the inventive concepts.
Figure 14:
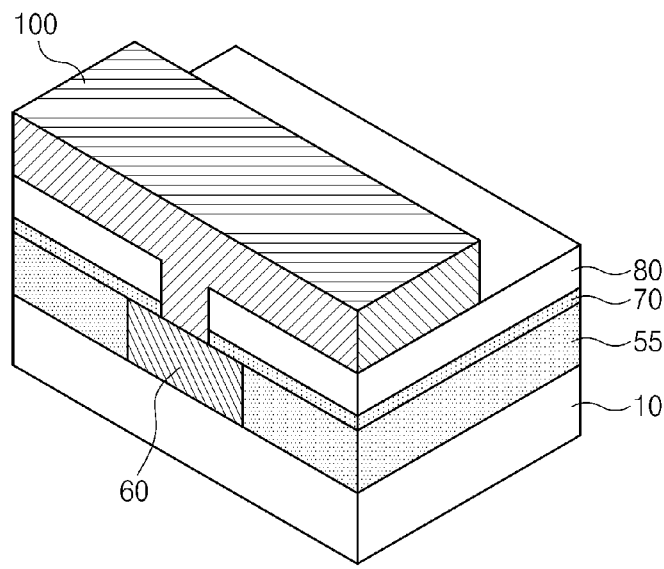

FIGS. 13 and 14 are schematic views illustrating three-dimensional e-fuse structures according to embodiments of the inventive concept.

Referring to FIG. 13, a lower electrode 60, a lower stress layer 70, an upper stress layer 80, and an upper electrode 100 are sequentially stacked on the lower layer 10. A fuse part 90 passes through the lower stress layer 70 and the upper stress layer 80 to connect the lower electrode 60 to the upper electrode 100. Accordingly, the lower stress layer 70 and the upper stress layer 80 surround a side wall of the fuse part 90.

According to an embodiment of the inventive concepts, the lower electrode 60 may be used as an anode, and the upper electrode 100 may be used as a cathode. However, according to another embodiment of the inventive concepts, the lower electrode 60 may be used as a cathode, and the upper electrode 100 may be used as an anode. The fuse part 90 may be formed of at least one of metal materials. When the fuse part 90 is formed through a typical wiring process or a damascene process, the fuse part 90 may be formed of the same material as that of the upper electrode 100 as illustrated in FIG. 14.

The fuse part 90 may include a depletion region and an accumulation region formed by superposing of thermomigration and electromigration as described above. In the three-dimensional e-fuse structure according to the embodiment of the FIG. 13, stress-migration may occur more constructively through the lower stress layer 70 and the upper stress layer 80 in a predetermined region where thermomigration and electromigration constructively occur. For example, the lower stress layer 70 may be a dielectric having a compressive stress characteristic for applying tensile stress to the fuse part 90, and the upper stress layer 80 may be a dielectric having a tensile stress characteristic for applying compressive stress to the fuse part 90. The lower stress layer 70 may have a thickness equal to ¼times the thickness of the fuse part 90, and the upper stress layer 80 may have a thickness equal to ¾times that of the fuse part 90.

According to a modified embodiment of the inventive concepts, a manufacturing process may require an etch stop layer (not shown) that is disposed under the lower stress layer 70 on the lower electrode 60. The etch stop layer may be a thin layer having the same stress characteristic as that of the lower stress layer 70. Alternatively, to use the lower stress layer 70 as the etch stop layer, the lower stress layer 70 may have etch selectivity for the upper stress layer 80 as well as a stress-migration characteristic.

According to the embodiments, the thin layers causing a stress difference are formed such that stress-migration constructively occurs in a predetermined region where thermomigration and electromigration constructively occur. In this case, the position of the region where thermomigration and electromigration constructively occur may be varied according to the physical property of the material constituting the fuse part and the geometric structure of the fuse part. Thus, the positions of the stress dielectrics (that is, the first dielectric 30 and the second dielectric 40) may be different from those of the previous embodiments according to the physical property of the material constituting the fuse part and the geometric structure of the fuse part. Since characteristics related with the thermomigration and the electromigration are predictable based on the above descriptions of the spirit of the inventive concepts and the well-known physical knowledge, it should be readily apparent to those skilled in the art that the inventive concepts are not limited to the aforementioned embodiments.

According to the embodiments, thermomigration constructively added to electromigration is used for an e-fuse program. According to the embodiments, the e-fuse structure is configured such that electromigration, thermomigration, and stress-migration constructively occur. Thus, the constructive superposing of the migrations reduces a voltage and a current required for programming the e-fuse, and also reduce the area of a circuit for fuse programming or fuse sensing.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. An e-fuse structure of a semiconductor device, the e-fuse structure comprising:
   an anode and a cathode;
   a fuse part having a depletion region, and an accumulation region bordering the depletion region at a location closer to the anode than the cathode, the fuse part extending longitudinally between and connecting the anode with the cathode, and the atomic flux of the fuse part being maximal at the border between the depletion region and the accumulation region; and
   a dielectric stressor comprising at least one of:
   a first dielectric film in contact with the depletion region of the fuse part, terminating on the fuse part at a boundary extending substantially along the border between the depletion region and the accumulation region, and applying a compressive stress to the depletion region, and
   a second dielectric film in contact with the accumulation region of the fuse part, terminating on the fuse part at a boundary extending substantially along the border between the depletion region and the accumulation region, and applying a tensile stress to the depletion region, wherein the second dielectric film is in direct contact with the first dielectric film and the accumulation region.

2. The e-fuse structure of claim 1, wherein the dielectric stressor comprises the first dielectric film, and the first dielectric film extends only over a portion of the fuse part located closer to the anode than to the cathode.

3. An e-fuse structure of a semiconductor device, the e-fuse structure comprising:
   an anode and a cathode;
   a fuse part having a depletion region, and an accumulation region bordering the depletion region at a location closer to the anode than the cathode, the fuse part extending longitudinally between and connecting the anode with the cathode, and the atomic flux of the fuse part being maximal at the border between the depletion region and the accumulation region;
   a compressive stress-inducing first dielectric film in contact with the depletion region of the fuse part so as to apply a compressive stress to the fuse part; and
   a tensile stress-inducing second dielectric film in contact with the accumulation region of the fuse part so as to apply a tensile stress to the fuse part, and
   wherein the first and second dielectric films directly contacting each other at a boundary that extends substantially along the border between the depletion region and the accumulation region of the fuse part.

4. The e-fuse structure of claim 3, in combination with a substrate and a transistor with a gate electrode integrated on the substrate, and
   wherein the anode, the cathode, and the fuse part are formed of the same material as at least one of materials constituting the gate electrode of the transistor, and are disposed at a substantially same height as that of the gate electrode of the transistor.

5. The e-fuse structure of claim 3, in combination with metal lines disposed on a substrate, and
   wherein the anode, the cathode, and the fuse part are formed of the same material as that of at least one of the metal lines.

6. The e-fuse structure of claim 3, wherein the anode and the cathode are disposed at different heights from each other relative to a substrate,
   the first and second dielectric films are disposed at different heights from each other relative to the substrate, and
   the depletion region and the accumulation region of the fuse part are in contact with a side wall of the first dielectric film and a side wall of the second dielectric film, respectively.

7. The e-fuse structure of claim 3, wherein the second dielectric film covers at least one fourth of the fuse part closest to the anode, and
   the first dielectric film covers at least one fourth of the fuse part located toward the anode from a center of the fuse part midway between the anode and the cathode.

8. The e-fuse structure as claimed in claim 1, wherein the fuse part is of metal.

9. The e-fuse structure as claimed in claim 8, wherein the fuse part is a linear segment of metallic material extending longitudinally between the anode and the cathode, and the border between the depletion region and the accumulation region of the fuse part is located substantially three fourths of the way along the length of the fuse part from the cathode to the anode.

10. The e-fuse structure as claimed in claim 1, wherein the border between the depletion region and the accumulation region of the fuse part is located substantially three fourths of the way along the length of the fuse part from the cathode to the anode.

11. The e-fuse structure as claimed in claim 3, wherein the fuse part is of metal.

12. The e-fuse structure as claimed in claim 11, wherein the fuse part is a linear segment of metallic material extending longitudinally between the anode and the cathode, and the border between the depletion region and the accumulation region of the fuse part is located substantially three fourths of the way along the length of the fuse part from the cathode to the anode.

13. The e-fuse structure as claimed in claim 3, wherein the border between the depletion region and the accumulation region of the fuse part is located substantially three fourths of the way along the length of the fuse part from the cathode to the anode.

* * * * *